(12) United States Patent
Kim

(10) Patent No.: US 7,869,278 B2
(45) Date of Patent: Jan. 11, 2011

(54) NONVOLATILE MEMORY DEVICE AND METHOD FOR FABRICATING THE SAME

(75) Inventor: Byong-Kook Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/695,390

(22) Filed: Jan. 28, 2010

(65) Prior Publication Data

US 2010/0128533 A1    May 27, 2010

Related U.S. Application Data

(62) Division of application No. 11/824,157, filed on Jun. 29, 2007, now Pat. No. 7,679,958.

(30) Foreign Application Priority Data

| Dec. 27, 2006 | (KR) | ............................ 2006-0134271 |
| Mar. 20, 2007 | (KR) | ............................ 2007-0027153 |

(51) Int. Cl.
*G11C 16/04* (2006.01)
(52) U.S. Cl. .............................. 365/185.17; 365/185.16
(58) Field of Classification Search ............ 365/185.17, 365/185.16, 185.25
See application file for complete search history.

(56) References Cited

U.S. PATENT DOCUMENTS

| 5,191,551 | A  |   | 3/1993  | Inoue |       |
|-----------|----|---|---------|-------|-------|
| 5,698,879 | A  |   | 12/1997 | Aritome et al. | |
| 6,953,965 | B2 |   | 10/2005 | Goda et al. | |
| 6,960,500 | B2 |   | 11/2005 | Shin et al. | |
| 2001/0002713 | A1 | * | 6/2001 | Goda et al. | ................. 257/315 |
| 2005/0023600 | A1 | * | 2/2005 | Shin et al. | ................... 257/315 |
| 2005/0272204 | A1 |   | 12/2005 | Gil | |
| 2006/0186485 | A1 |   | 8/2006 | Cho et al. | ................... 257/401 |

FOREIGN PATENT DOCUMENTS

| KR | 10-2004-0102349 | 12/2004 |
| KR | 10-2005-0074328 | 7/2005 |
| KR | 10-2006-0060494 | 6/2006 |

* cited by examiner

*Primary Examiner*—Vu A Le
(74) *Attorney, Agent, or Firm*—Blakely, Sokoloff, Taylor & Zafman

(57) ABSTRACT

A nonvolatile memory device includes a plurality of strings each of which is configured with a first select transistor, a second select transistor, and a plurality of memory cells connected in series between the first and second select transistors. A common source line is connected to a source of the second select transistor. A metal interconnection is electrically insulated from the common source line, and connected to the source of the second select transistor.

7 Claims, 4 Drawing Sheets

US 7,869,278 B2

NONVOLATILE MEMORY DEVICE AND METHOD FOR FABRICATING THE SAME

CROSS-REFERENCE TO RELATED APPLICATION

The present patent application is a Divisional application claiming the benefit of application Ser. No. 11/824,157, filed Jun. 29, 2007 now U.S. Pat. No. 7,679,958.

CROSS-REFERENCES TO RELATED APPLICATIONS

The present invention claims priority of Korean patent application numbers 10-2006-0134271 and 10-2007-0027153, respectively filed on Dec. 27, 2006 and Mar. 20, 2007, which are incorporated by reference in their entirety.

BACKGROUND OF THE INVENTION

The present invention relates to a semiconductor memory device and a method for fabricating the same, and more particularly to a nonvolatile memory device and a method for fabricating the same.

Recently, demands for a nonvolatile memory device, which can be electrically programmed and erased and does not require a refresh operation for rewriting data periodically, are steadily increasing. To develop a large-capacity memory device that can store massive data, research for high integration technology of a memory device has been actively conducted. Here, 'programming' means writing data to a memory cell, whereas 'erasing' means removing data which have been written to the memory cell.

Thus, to realize a highly-integrated nonvolatile memory device, a NAND type flash memory device has been proposed in which a plurality of memory cells are connected to each other in series, that is, adjacent cells share one drain or one source, so that the plurality of memory cells constitute one string. The NAND type flash memory device, which sequentially reads data unlike a NOR type flash memory device, performs programming or erasing operations in such a manner that the threshold voltage of the memory cell is controlled by injecting electrons into a floating gate or removing electrons from the floating gate by Fowler-Nordheim (FN) tunneling.

FIG. 1 illustrates a plan view of a memory cell array of a typical NAND type flash memory device. FIG. 2 illustrates a cross-sectional view taken along the line I-I' of FIG. 1 (a bit line direction), and FIG. 3 illustrates a cross-sectional view taken along the line II-II' of FIG. 1 (a word line direction). Herein, a string configuration having 6 memory cells MC0~MC5 is illustrated as an example.

Referring to FIGS. 1 to 3, a plurality of strings are arranged in the memory cell array of the typical NAND type flash memory device. Each of the strings includes a drain select transistor (not shown), a source select transistor SST, and a plurality of memory cells MC0~MC5 connected in series between the drain select transistor and the source select transistor SST. In addition, a source of each source select transistor SST, e.g., a junction region formed by implanting impurity ions into an active region ACTIVE, is commonly connected to a common source line CSL. The common source line CSL is directly connected to a ground terminal through a contact CT and a metal interconnection M1.

However, according to the typical memory cell array structure of the NAND type flash memory device, it is often difficult to perform a post-annealing treatment such as a furnace annealing using oxygen ($O_2$) gas, in the case that the common source line CSL is formed of a metallic material such as tungsten (W) or the like. This limitation will be more fully described below.

As illustrated in FIGS. 2 and 3, in order to directly connect the metal interconnection M1 to the common source line CSL, a portion of the common source line CSL should be exposed after the common source line CSL is formed. However, when the furnace annealing is performed using $O_2$ gas in a state that the portion of the common source line CSL is exposed, the exposed portion of the common source line CSL is oxidized due to the $O_2$ gas.

Accordingly, a rapid thermal annealing (RTA) treatment is employed instead of the furnace annealing to avoid the oxidation. The RTA treatment may lead to the increase of a thermionic field emission (TFE) current due to the stress generated during the RTA treatment. The increase of the TFE current causes the leakage current of the junction region to increase to thereby reduce a self-boosting level, which makes the program disturbance characteristic deteriorated.

For reference, a heat treatment such as RTA is frequently performed in fabricating a semiconductor device. For example, the RTA treatment is performed to form an ohmic contact between the active region and the metal interconnection M1 in a peripheral region after the common source line CSL is formed.

SUMMARY OF THE INVENTION

Embodiments of the present invention are directed toward providing a nonvolatile memory device and a method for fabricating the same in which a heat treatment can be stably performed even after the common source line is formed to thereby prevent a common source line from being oxidized.

In accordance with an embodiment of the present invention, there is provided a nonvolatile memory device. The nonvolatile memory device includes a plurality of strings each of which is configured with a first select transistor, a second select transistor, and a plurality of memory cells connected in series between the first and second select transistors. A common source line is connected to a source of the second select transistor. A metal interconnection is electrically insulated from the common source line, and connected to the source of the second select transistor.

In accordance with another embodiment of the present invention, there is provided a method for fabricating a nonvolatile memory device. The method includes forming a first select transistor, a second select transistor, and a plurality of memory cells over a substrate, forming a common source line to be connected to a source of the second select transistor, and forming a metal interconnection connected to the source of the second select transistor and electrically insulated from the common source line.

DESCRIPTION OF SPECIFIC EMBODIMENTS

In the typical method, a portion of a common source line should be exposed to connect the common source line and a metal interconnection to each other. However, embodiments of the present invention provide a NAND type flash memory device that can interconnect the common source line and the metal interconnection without exposing the common source line, which minimizes a limitation associated with a furnace annealing treatment carried out after the common source line is formed.

Figure 1:
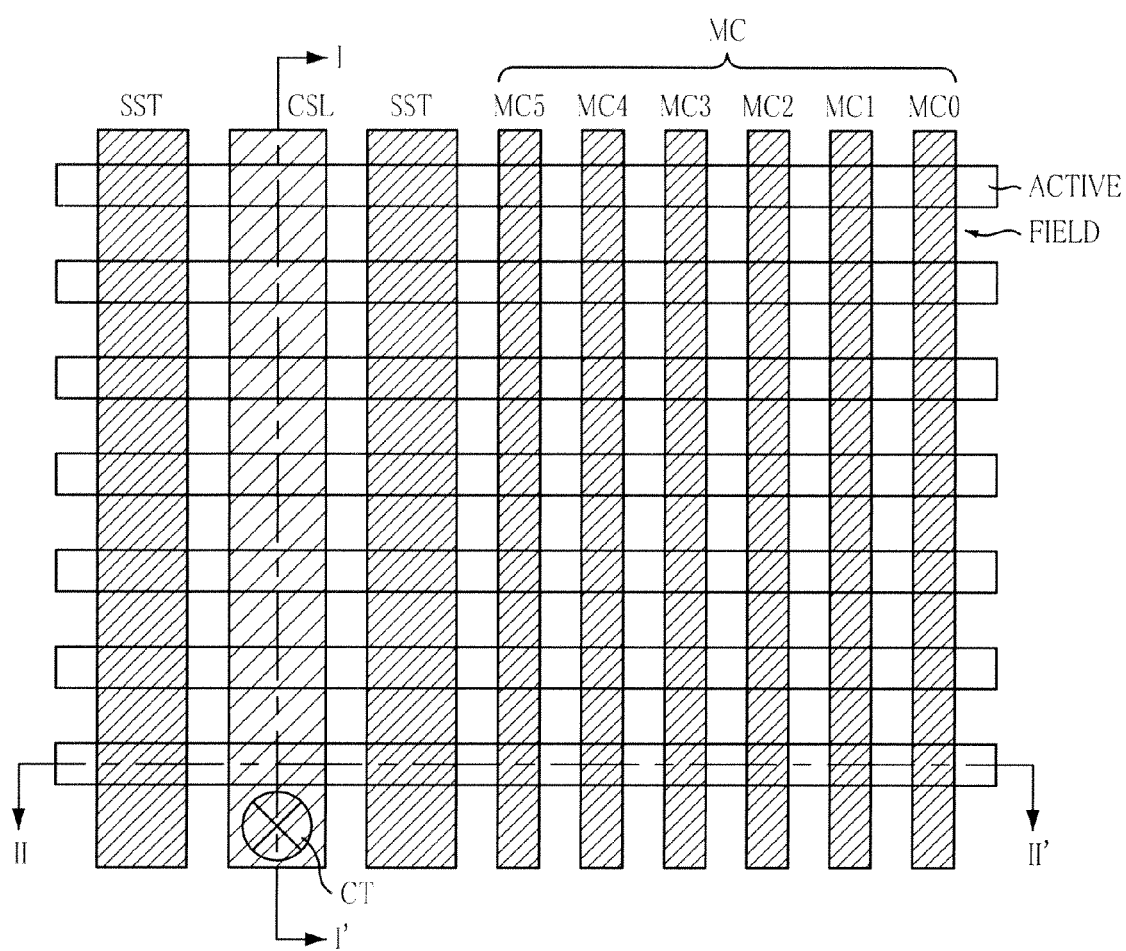
FIG. 1 illustrates a plan view of a memory cell array of a typical NAND type flash memory device.
Figure 2:
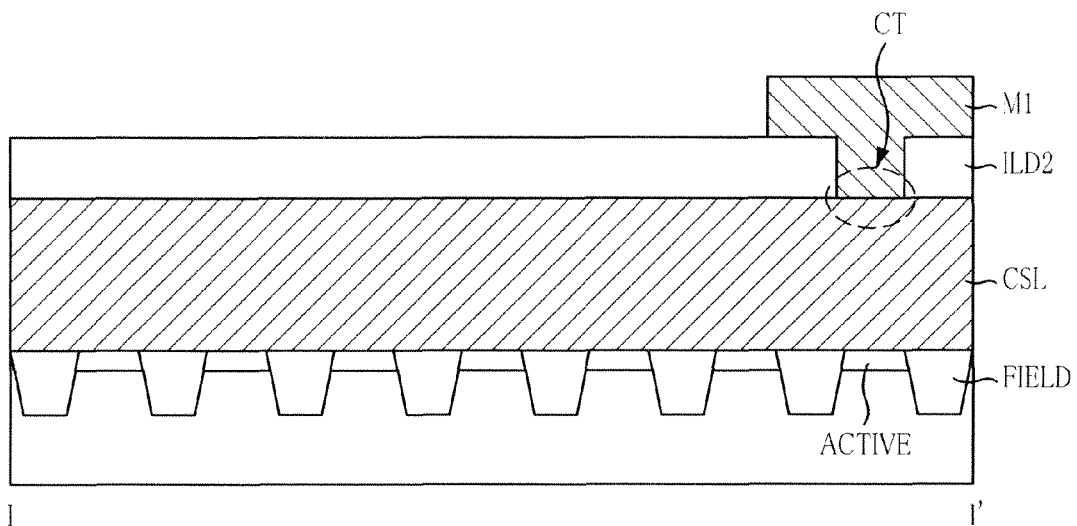
FIG. 2 illustrates a cross-sectional view taken along the line I-I' of FIG. 1 (a bit line direction).
Figure 3:
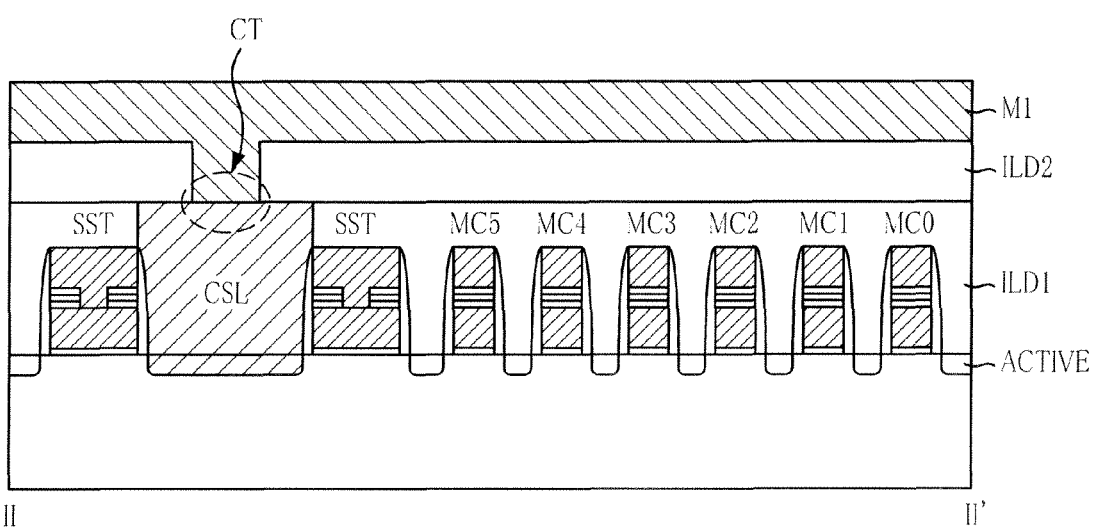
FIG. 3 illustrates a cross-sectional view taken along the line II-II' of FIG. 1 (a word line direction).
Figure 4:
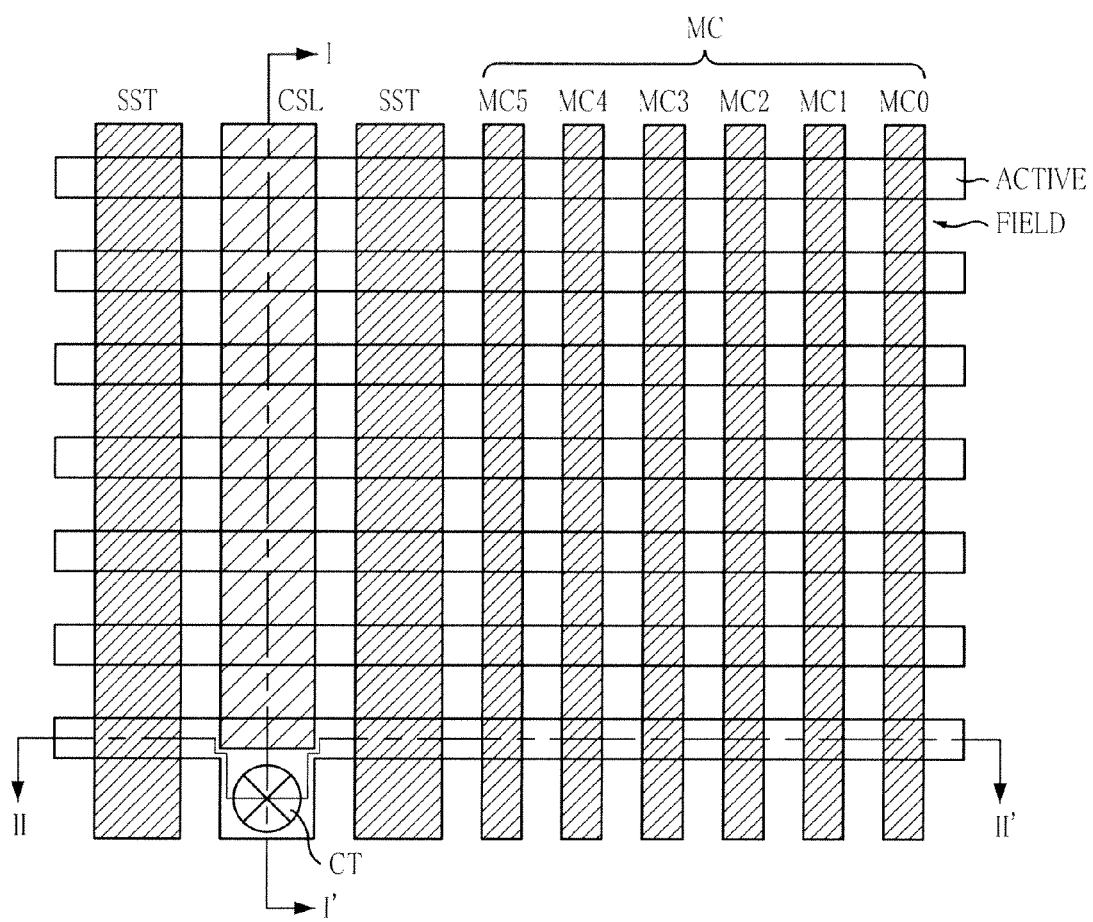
FIG. 4 illustrates a plan view of a memory cell array of an NAND type flash memory device in accordance with an embodiment of the present invention.
Figure 5:
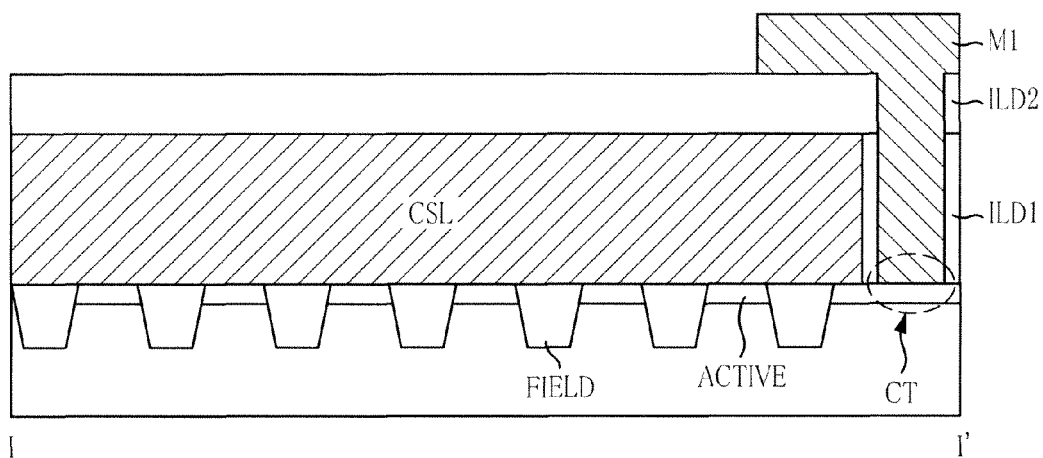
FIG. 5 illustrates a cross-sectional view taken along the line I-I' of FIG. 4 (a bit line direction).
Figure 6:
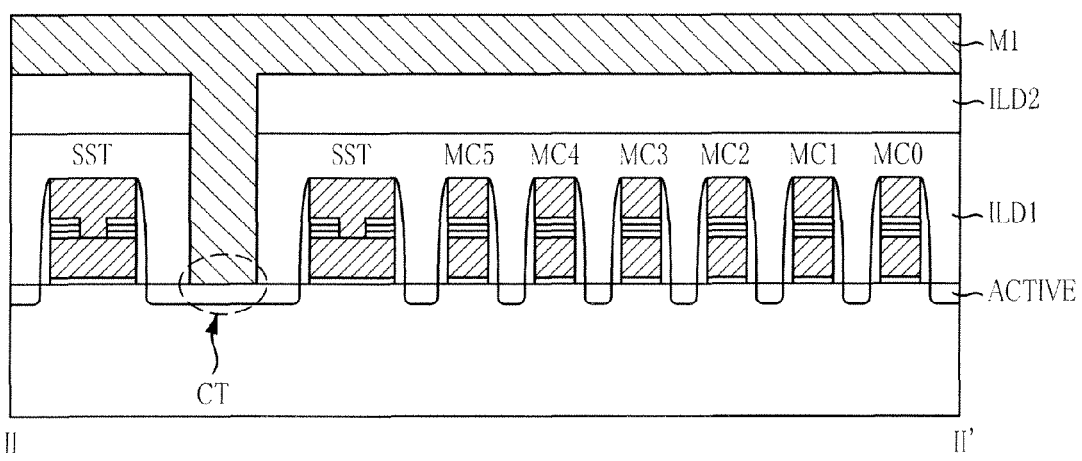
FIG. 6 illustrates a cross-sectional view taken along the line II-II' of FIG. 4 (a word line direction).

FIG. 4 illustrates a plan view of a memory cell array of an NAND type flash memory device in accordance with an embodiment of the present invention. FIG. 5 illustrates a cross-sectional view taken along the line I-I' of FIG. 4 (a bit line direction), and FIG. 6 illustrates a cross-sectional view taken along the line II-II' of FIG. 4 (a word line direction). Herein, a string configuration having 6 memory cells MC0 to MC5 will be illustrated as an example. In the figures, the dimensions of layers and regions are exaggerated for clarity of the illustration. It will also be understood that when a layer is referred to as being 'on' another layer or substrate, it can be directly on the other layer or substrate, or intervening layers may also be present between them. Further, like reference numerals refer to like elements throughout.

Referring to FIGS. 4 to 6, the memory cell array of the NAND type flash memory device in accordance with the embodiment of the present invention has a structure in which a metal interconnection M1 is connected to a common source line CSL through a junction region formed in an active region ACTIVE, instead of being directly connected to the common source line CSL, which will be illustrated in detail below.

A portion of the active region ACTIVE overlapping one side (one end) of the common source line CSL, i.e., a portion of a junction region of a source select transistor SST, protrudes in a direction in which the common source line CSL extends. The protrusion of the active region ACTIVE is formed such that it does not overlap the common source line CSL. In addition, the width of the protrusion may be equal to or smaller than that of the common source line CSL. The protrusion may be formed in various shapes such as square, rectangle, triangle, circle, diamond, trapezoid, etc, as far as photolithography allows. The protrusion is defined when an isolation structure (usually called field oxide (FOX)) is formed in a field region FIELD through a shallow trench isolation (STI) process. Like the active region ACTIVE serving as respective junction regions (source and drain regions) of the memory cells MC0~MC5, a drain select transistor and the source select transistor SST, the protrusion also has N-type or P-type conductivity by doping impurity ions through an implantation process performed after formation of a gate electrode. The protrusion is electrically connected to the metal interconnection M1 through a contact CT. The common source line CSL is electrically insulated from the metal interconnection M1 in virtue of inter-layer dielectrics ILD1 and ILD2 interposed therebetween.

The common source line CSL may be formed after the formation of the isolation structure, the memory cells MC0 to MC5, the drain select transistor and the source select transistor SST, and the inter-layer dielectrics ILD1 and ILD2 are formed on the common source line CSL. The inter-layer dielectrics ILD1 and ILD2 are etched such that a source of at least one source select transistor SST is exposed to form a contact hole (not shown). The metal interconnection M1 is formed to fill the contact hole. As a result, the metal interconnection M1 is in contact with the source of at least one source select transistor SST.

As described above, in accordance with the embodiment of the present invention, the common source line and the metal interconnection are not directly connected to each other through the contact, but they are interconnected through the active region into which impurity ions are doped. Therefore, it is possible to prevent the exposed common source line from being oxidized even during a furnace annealing treatment performed after the common source line is formed.

What is claimed is:

1. A nonvolatile memory device comprising:
a plurality of strings each of which is configured with a first select transistor, a second select transistor, and a plurality of memory cells connected in series between the first and second select transistors;
a common source line connected to a source of the second select transistor; and
a metal interconnection electrically insulated from the common source line, and connected to the source of the second select transistor.

2. The nonvolatile memory device of claim 1, wherein the source has a protrusion in a direction in which the common source line extends.

3. The nonvolatile memory device of claim 2, wherein the metal interconnection is electrically connected to the protrusion.

4. The nonvolatile memory device of claim 2, wherein the protrusion is formed in a shape selected from square, rectangle, triangle, circle, diamond, and trapezoid.

5. The nonvolatile memory device of claim 1, wherein the metal interconnection is disposed on a plane different from a plane on which the common source line is disposed.

6. The nonvolatile memory device of claim 1, further comprising an insulation layer interposed between the metal interconnection and the common source line.

7. The nonvolatile memory device of claim 1, wherein the first selection transistor is a drain selection transistor and the second selection transistor is a source selection transistor.

* * * * *